US011104496B2

(12) United States Patent
Chuang et al.

(10) Patent No.: US 11,104,496 B2
(45) Date of Patent: Aug. 31, 2021

(54) NON-SEALED RETICLE STORAGE DEVICE

(71) Applicant: GUDENG PRECISION INDUSTRIAL CO., LTD., New Taipei (TW)

(72) Inventors: Chia-Ho Chuang, New Taipei (TW); Hsing-Min Wen, New Taipei (TW); Hsin-Min Hsueh, New Taipei (TW); Yi-Hsuan Lee, New Taipei (TW); Ming-Chien Chiu, New Taipei (TW)

(73) Assignee: GUDENG PRECISION INDUSTRIAL CO., LTD., New Taipei (TW)

( * ) Notice: Subject to any disclaimer, the term of this patent is extended or adjusted under 35 U.S.C. 154(b) by 0 days.

(21) Appl. No.: 16/923,458

(22) Filed: Jul. 8, 2020

(65) Prior Publication Data

US 2021/0048755 A1   Feb. 18, 2021

Related U.S. Application Data

(60) Provisional application No. 62/887,753, filed on Aug. 16, 2019.

(51) Int. Cl.
| | |
|---|---|
| *B65D 53/06* | (2006.01) |
| *B65D 85/38* | (2006.01) |
| *B01D 46/00* | (2006.01) |
| *B01D 46/42* | (2006.01) |
| *B01D 46/54* | (2006.01) |
| *F16K 27/02* | (2006.01) |
| *G03F 1/66* | (2012.01) |

(Continued)

(52) U.S. Cl.
CPC ........... *B65D 53/06* (2013.01); *B01D 46/001* (2013.01); *B01D 46/4272* (2013.01); *B01D 46/543* (2013.01); *B65D 81/24* (2013.01); *B65D 85/30* (2013.01); *B65D 85/38* (2013.01); *F16K 27/02* (2013.01); *G03F 1/66* (2013.01); *G03F 7/70916* (2013.01); *H01L 21/67359* (2013.01); *H01L 21/67389* (2013.01); *B01D 2271/027* (2013.01); *B01D 2279/51* (2013.01)

(58) Field of Classification Search
CPC .. B01D 46/00; B01D 46/001; B01D 46/4272; B01D 46/543; B01D 2271/027; B01D 2279/51; B65D 53/06; B65D 81/24; B65D 85/30; B65D 85/38; B65D 85/48; F16K 27/02; G03F 1/66; G03F 7/70916; H01L 21/67359; H01L 21/67386; H01L 21/67389
USPC ...................................... 206/316.1
See application file for complete search history.

(56) References Cited

U.S. PATENT DOCUMENTS 8,231,005 B2 * 7/2012 Kolbow ................. B65D 85/48
206/710
9,745,119 B2 * 8/2017 Kolbow ............ H01L 21/67386
(Continued)

FOREIGN PATENT DOCUMENTS

TW           201903942 A      1/2019

*Primary Examiner* — Bryon P Gehman
(74) *Attorney, Agent, or Firm* — Locke Lord LLP; Tim Tingkang Xia, Esq.

(57) ABSTRACT

A reticle storage device includes a top lid having a ceiling and a cover surrounding the ceiling, and a bottom lid having a carrier and a peripheral structure surrounding the carrier. When the top lid engages with the bottom lid, a passage is defined therebetween and therefore the reticle storage device is not sealed.

11 Claims, 5 Drawing Sheets

(51) Int. Cl.
*H01L 21/673* (2006.01)
*B65D 81/24* (2006.01)
*B65D 85/30* (2006.01)
*G03F 7/20* (2006.01)

(56) References Cited

U.S. PATENT DOCUMENTS

| | | | |
|---|---|---|---|
| 9,919,863 B2 * | 3/2018 | Lystad | H01L 21/67386 |
| 10,670,976 B2 * | 6/2020 | Hsueh | G03F 1/66 |
| 10,876,647 B2 * | 12/2020 | Chiu | B01D 46/4272 |

* cited by examiner

NON-SEALED RETICLE STORAGE DEVICE

RELATED APPLICATIONS

This application claims priority to and the benefit of U.S. Provisional patent 62/887,753, filed on Aug. 16, 2019, the entire contents of which are incorporated herein by reference as if fully set forth below in its entirety and for all applicable purposes.

BACKGROUND

Technical Field

The present invention relates to a reticle storage device, particularly to a non-sealed (i.e. non-hermetic) reticle pod.

Description of Related Art

A known reticle pod generally includes an outer pod and an inner pod, wherein the outer pod is the outset layer of the reticle pod and the inner pod is accommodated in the outer pod. Some types of the outer pod may be composed of a top lid and a bottom lip. Similarly, the inner pod may be composed of a top lid and a bottom lid while receives a reticle therein.

Contamination control for extreme ultraviolet (EUV) reticle mainly depends on the combination of the top and bottom lids of the inner pod to prevent particles and dusts from entering the inner pod. Conventional design for the inner pod having the top and bottom lids uses hermetic means to block flow communication between the internal pod environment and the external environment in order to stop air flow between the inside and outside of the pod, and therefore prevent a reticle within the inner pod from being contaminated. However, such hermetic design may have some drawbacks. First of all, surface sealing is hard to fulfill. For example, a strict criterion with respect to roughness of involved contact surfaces may be required. Moreover, in some cases where there is a high pressure difference between the internal pod environment and the external environment caused by temperature and pressure change, a significant air disturbance may be generated during opening of the inner pod (i.e. separating the top and bottom lids), which instead causes the reticle contaminated. This is generally happened during processes of transferring the outer pod or inner pod. Furthermore, the hermetic design generally requires the top and bottom lids, when engaged, have a certain amount of contact areas, which possibly causes generation of particles due to collision among these hard pieces and therefore contaminates the reticle received in the inner pod as well.

Therefore, there remains a need for developing a solution to overcome the foregoing drawbacks existing in the conventional hermetic design of inner pod, in order to ensure a reticle received in an inner pod stays in the relatively safe environment during the processes of both opening and closing the inner pod.

SUMMARY OF INVENTION

An objective of the invention is to provide a reticle storage device including: a top lid having a ceiling and a cover surrounding the ceiling; a bottom lid, having a carrier and a peripheral structure surrounding the carrier; and a plurality of bumps, configured to lift the top lid above the bottom lid. The carrier and the ceiling as well as the cover define a reticle accommodation space when the top lid engages with the bottom lid, the cover of the top lid faces the peripheral structure of the bottom lid. At least one portion of the cover of the top lid and at least one portion of the peripheral structure of the bottom lid define a passage by the plurality of bumps, and the reticle accommodation space is not sealed due to the passage.

In one preferred embodiment, the passage is composed of at least two extending structures of different directions, said at least two extending structures of different directions are defined by a first female member formed on the cover and a first male member formed on the peripheral structure, wherein the first female member structurally corresponds to the first male member.

In one preferred embodiment, the passage is composed of at least two extending structures of different directions, said at least two extending structures of different directions are further defined by a second male member formed on the cover and a second female member formed on the peripheral structure, wherein the second male member structurally corresponds to the second female member.

In one preferred embodiment, the first female member surrounding the second male member, the first male member surrounds the second female member.

In one preferred embodiment, the passage is at least composed of a first horizontal extending structure, a second horizontal extending structure and a vertical extending structure, the vertical extending structure is in between the first horizontal extending structure and the second horizontal extending structure, the first horizontal extending structure and the second horizontal extending structure are extending at different height levels respectively.

In one preferred embodiment, the peripheral structure of the bottom lid and the carrier define a trench therebetween, the trench is extending between the passage and the reticle accommodation space.

In one preferred embodiment, the plurality of bumps extends downward from the cover, the peripheral structure of the bottom lid has a plurality of accommodation recesses corresponding to the plurality of bumps and extending downward from the peripheral structure, wherein each of the accommodation recesses is configured to partially receive the corresponding bump such that the cover of the top lid is lifted above the peripheral structure of the bottom lid.

Another objective of the invention is to provide a reticle storage device including: a top lid having a ceiling and a cover surrounding the ceiling; and a bottom lid having a carrier and a peripheral structure surrounding the carrier. The carrier and the ceiling as well as the cover define a reticle accommodation space when the top lid engages with the bottom lid. The cover of the top lid faces the peripheral structure of the bottom lid, at least one portion of the cover of the top lid and at least one portion of the peripheral structure of the bottom lid define a passage, and the reticle accommodation space is not sealed due to the passage. The passage is composed of multiple extending structures. The passage has a first turning point and a second point, the first turning point and the second turning point are capable of changing air flow direction.

In one preferred embodiment, the passage further has an inlet, the first turning point locates at a height level higher than that of the inlet, the second turning point locates at a height level lower than that of the inlet.

In one preferred embodiment, the peripheral structure and the carrier define a trench therebetween, the trench is extending between the passage and the reticle accommodation space.

In one preferred embodiment, the cover of the top lid has a plurality of bumps extending downward from the cover, the peripheral structure of the bottom lid has a plurality of accommodation recesses corresponding to the bumps and extending from the peripheral structure, wherein each of the accommodation recesses is configured to partially receive the corresponding bumps such that the cover of the top lid is lifted above the peripheral structure of the bottom lid.

Advantages and features of the present invention will be discussed in details through the following description and drawings illustrated by the principle of invention.

BRIEF DESCRIPTION OF THE DRAWINGS

The above-mentioned and other features and advantages of the disclosure can be better understood with reference to the following detailed description and drawings.

DETAILED DESCRIPTION

Various exemplary embodiments will be described in detail with reference to the accompanying drawings that form a part of the present disclosure. Also, these embodiments are described with examples that could be carried out to achieve said embodiments, wherein sufficient details are provided to allow a person ordinarily skilled in the art to achieve said embodiments. It will be appreciated that, without departing from the spirit and scope of said embodiments, other embodiments could be used and other changes could be made. In addition, despite the foregoing, appearances of the phrase "in one embodiment" are not necessarily referring to the same or one single embodiment. Therefore, the following detailed description is not to be taken in a limiting sense, and the scope of said embodiments is defined by the appended claims alone.

Unless otherwise specified in the entire description and the appended claims, each of the following terms carries the meaning specifically defined below. As used herein, unless otherwise specified, the term "or" is to be taken in an inclusive sense, and is equivalent to the term "and/or." Unless otherwise specified herein, the term "according to" is not to be taken in an exclusive sense, and allows references to be made to many other factors not described herein. Additionally, in the entire description, the terms "a," "one" and "the" are also used in the plural sense. The term "in" is used herein to mean both "in" and "on."

The invention aims to provide a non-sealed reticle storage device. FIG. 1 and FIG. 2 show a top view and a side view of a reticle storage device. The reticle storage device includes a top lid (101) and a bottom lid (102). A reticle (not shown) can be accommodated between the top lid (101) and the bottom lid (102). A particular feature of said non-sealed reticle storage device is that the accommodated reticle is not substantially sealed when the top lid (101) engages with the bottom lid (102). In other words, a reticle accommodation space of the reticle storage device has a pressure substantially identical to that of the external environment. Despite not shown, said reticle storage device can further be received in an outer pod. The non-sealed reticle storage device according to the invention mainly relates to an inner pod. The top lid (101) and the bottom lid (102) may be provided with structures or contacts on their surface in order to connect with the outer pod.

Figure 1A:
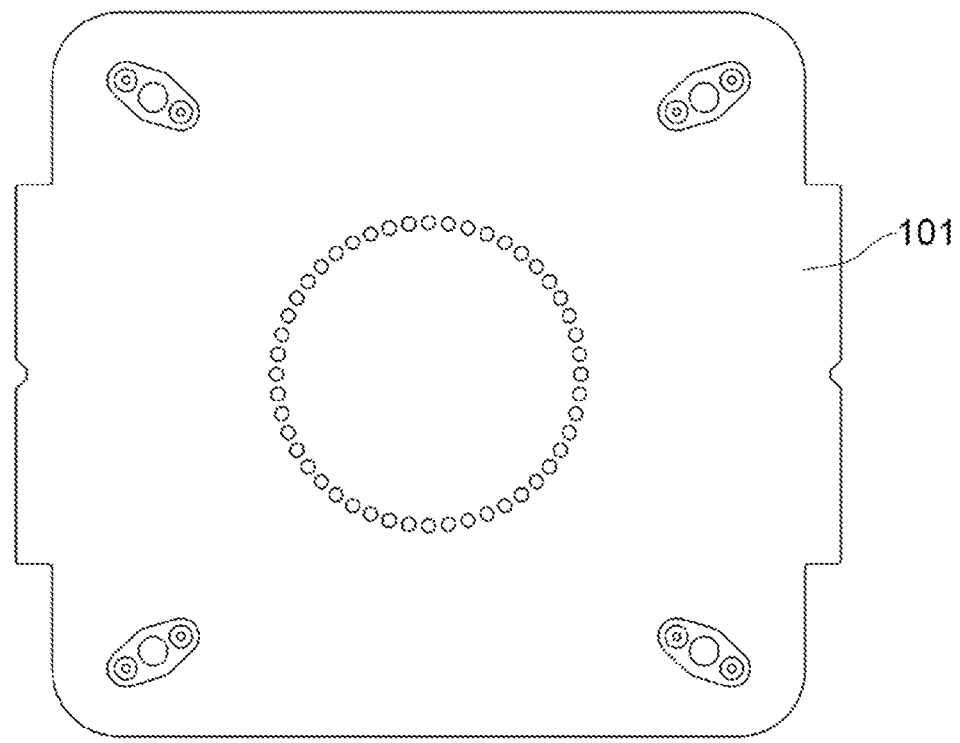
FIGS. 1A and 1B show a top view and a side view of a reticle storage device respectively.
Figure 1B:
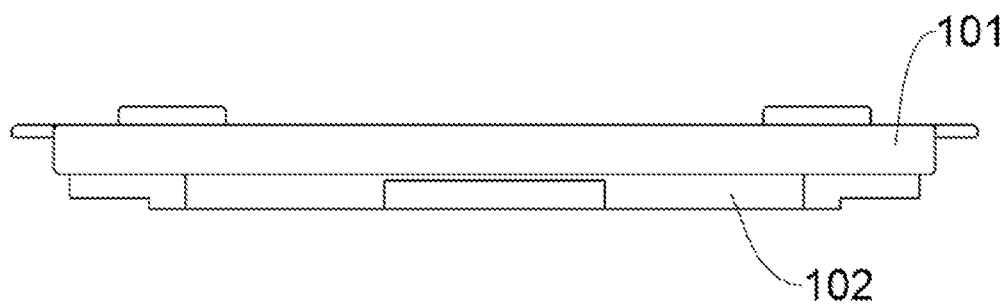
Figure 2:
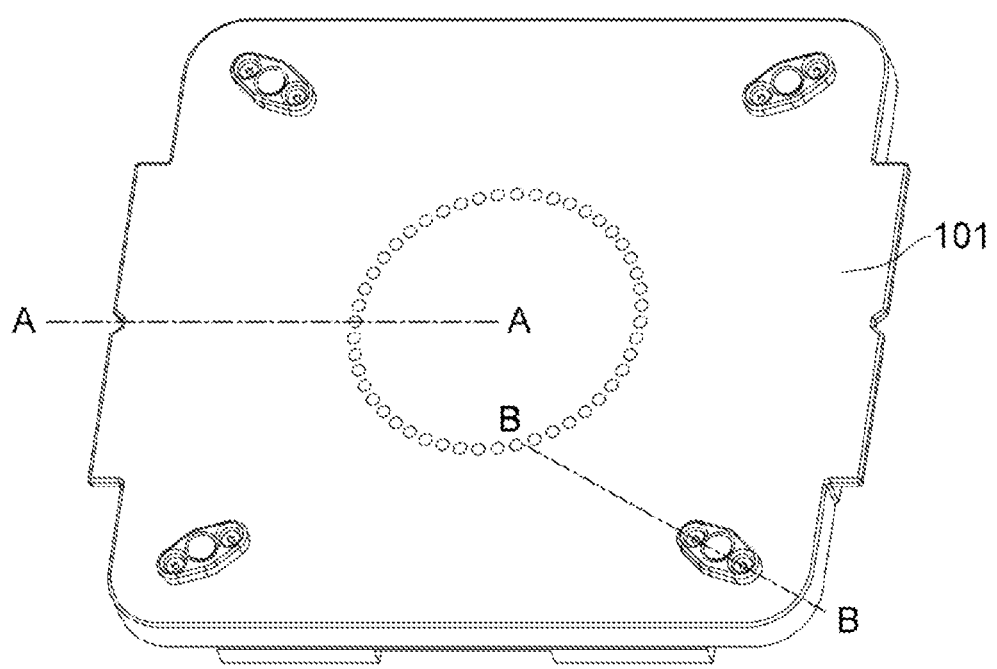
FIG. 2 shows a perspective view of the reticle storage device.

FIG. 1 is a top view that shows that the reticle storage device according to the invention has a center region and four edges surrounding the center region. Said reticle accommodating space is generally beneath the center area. The reticle storage device is provided with particular structures between the center region and the edges such that passages with specific paths are formed when the top lid (101) engages with the bottom lid (102), giving the reticle storage device said non-sealed property. Air particles passing through the passages having specific paths may possibly be captured and therefore avoided from contaminating the accommodated reticle. As shown in FIG. 1A and FIG. 2, the top lid (101) may be further provided with plural inlet holes (not numbered) on its top, which is used for air backfilling, and a filer (not shown) used for filtering particles.

Figure 3A:
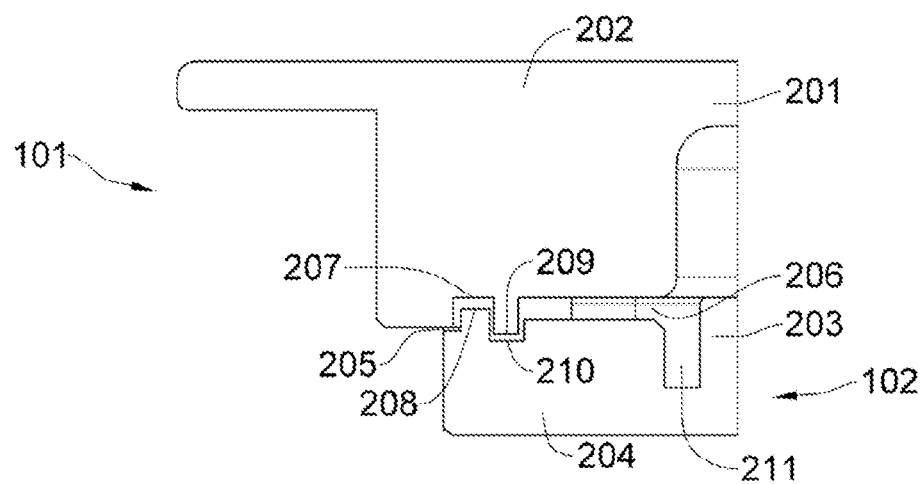
FIGS. 3A to 3C are cross-sectional views according to an AA line, showing three embodiments of the passage according to the invention.
Figure 3B:
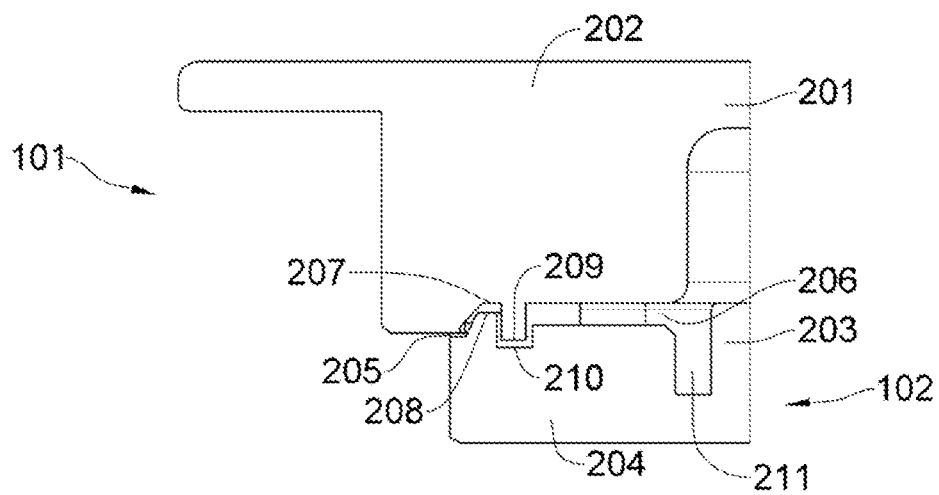
Figure 3C:
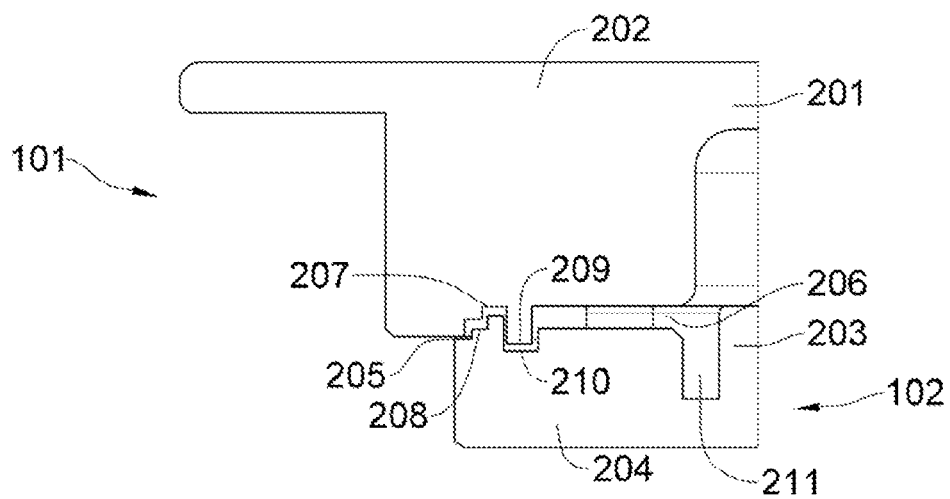
Figure 4A:
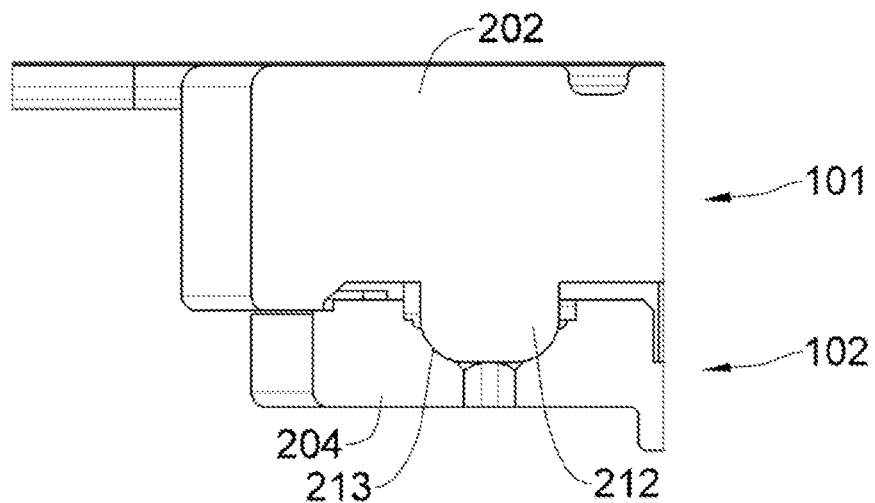
FIG. 4A is a cross-sectional view according to a BB line, illustrating a first embodiment of supporting means.
Figure 4B:
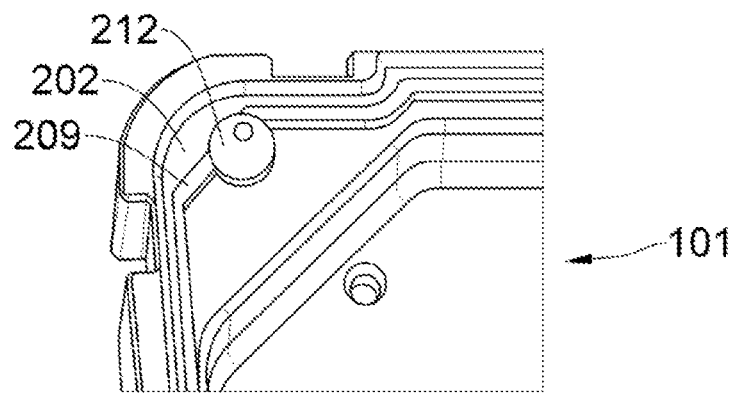
FIGS. 4B to 4C illustrate supporting means used for a top lid and a bottom lid respectively.
Figure 4C:
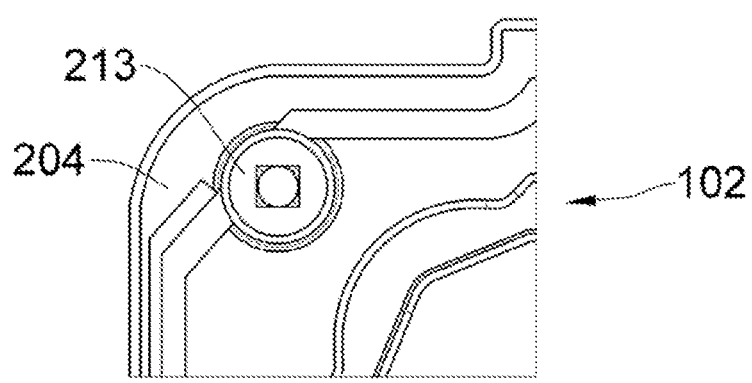
Figure 5:
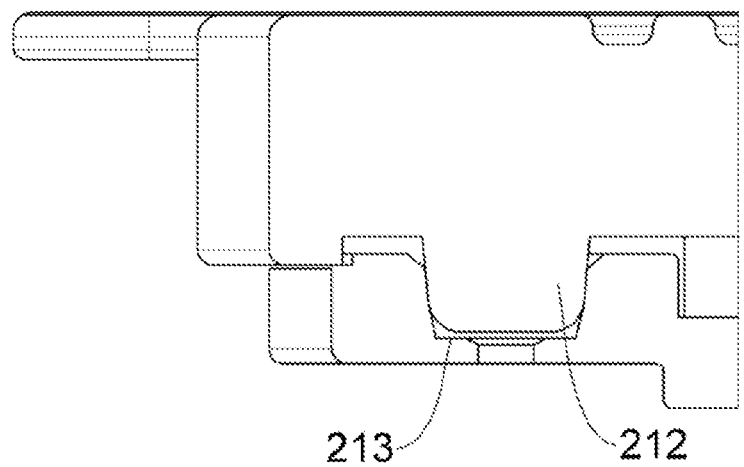
FIG. 5 is a cross-sectional view according to the BB line, illustrating a second embodiment of supporting means.
Figure 6:
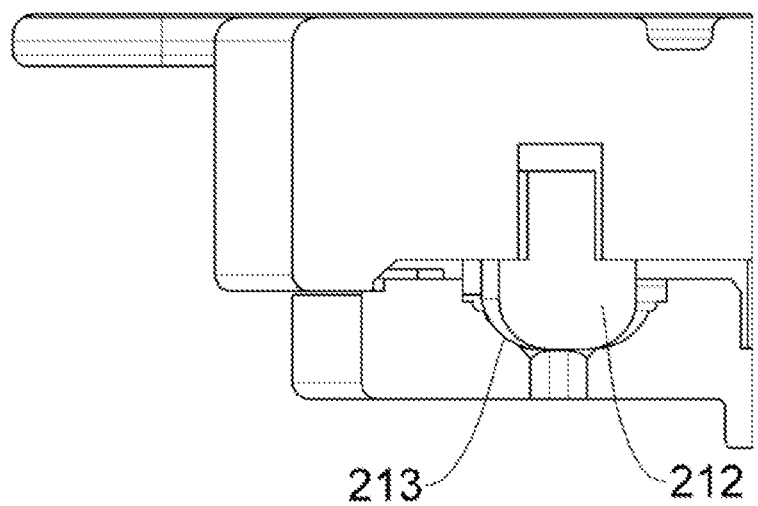
FIG. 6 is a cross-sectional view according to the BB line, illustrating a third embodiment of supporting means.

FIG. 2 shows a perspective view of the reticle storage device according to the invention with an AA line and a BB line. FIGS. 3A to 3C are cross-sectional views according to the AA line, showing three embodiments of the passage. Despite only one side of the passage is shown, it is expected said passage also extends at each side of the reticle storage device. In some cases, only certain sides of the reticle storage device have the non-sealed passage according to the invention while other sides is sealed. In addition, FIG. 4A is a cross-sectional view according to the BB line, FIGS. 4B and 4C illustrate a first embodiment of a coupling structure of the top lid and the bottom lid. FIG. 5 illustrates a second embodiment of a coupling structure of the top lid and the bottom lid. FIG. 6 illustrates a third embodiment of a coupling structure of the top lid and the bottom lid.

FIGS. 3A to 3C, a top lid (101) has a ceiling (201) and a cover (202) extending horizontally and downwardly from the ceiling (201). The cover (202) has a relatively large thickness. Despite only a portion of view is shown, it is expected the cover (202) surrounds the ceiling (201) and extends toward to the four edges of the top lid (101). The bottom lid (102) has a carrier (203) and a peripheral structure (204). Said carrier (203) provides a carrying surface for carrying a reticle. The carrier (203) may provide plural supporting or restricting members to define a reticle accommodation region. The peripheral structure (204) extending along the four edges of the bottom lid (102) surrounds the carrier (203) and is slightly lower than the carrying surface of the carrier (203). In some embodiments, the peripheral structure (204) may be higher than the carrying surface of the carrier (203).

When the top lid (101) and the bottom lid (102) engage with each other, the carrier (203) and the ceiling (201) as well as the cover (202) define the reticle accommodation space. The cover (202) of the top lid (101) faces the peripheral structure (204) of the bottom lid (102) without fully contact with each other. Alternatively, the cover (202) and the peripheral structure (204) may be partially contact with each other. At least one part of the cover (202) of the top lid (101) and at least one part of the peripheral structure (204) of the bottom lid (102) define a passage that causes the reticle accommodation space non-sealed. The passage has an inlet (205) and an outlet (206). The inlet (205) is a gap at the outermost side between the cover (202) and the peripheral structure (204). The outlet (206) is the terminal at the innermost passage defined between the cover (202) and the peripheral structure (204). It should be understood that the phrases of inlet (205) and the outlet (206) are not used to limit the flow direction. In fact, air flow should be bidirectional. In addition, it should be understood that design of the cover (202), the carrier (203) and the peripheral structure (204) determines a relationship between the inlet (205), the outlet (206) and the reticle accommodation space, i.e. this determines a relative relationship between the passage and the reticle accommodation space. The drawings merely illustrate a type of configuration where the passage is lower than the reticle accommodation space.

The passage is composed of at least two extending structures that are presented in different directions. As the embodiment illustrated in FIG. 3A, the at least two extending structures of different directions are defined by a first female member (207) of the cover (202) and a first male member (208) of the peripheral structure (204). The first female member (207) structurally corresponds to the first male member (208), and the first male member (208) is partially received in the first female member (207). Despite only cross-sectional view is shown, it should be understood that the first female member (207) and the first male member (208) are extending structures along the cover (202) and peripheral structure (204) surrounding the reticle accommodation space. The first female member (207) and the first male member (208) define tow vertical extending structures and one horizontal extending structure from the inlet (205) to outlet (206).

The at least two extending structures of different directions of the passage are further defined by a second male member (209) of the cover (202) and a second female member (210) of the peripheral structure (204). The second male member (209) structurally corresponds to the second female member (210), and the second male member (209) is partially received in the second female member (210). It should be expected that the second male member (209) and the second female member (210) are also extending structures along the cover (202) and the peripheral structure (204) surrounding the reticle accommodation space. Also, the second male member (209) and the second female member (210) define two vertical extending structures and one horizontal extending structure between the inlet (205) and outlet (206).

The first female member (207) surrounds the second male member (209) on the cover (202). The first male member (208) surrounds the second female member (210) on the peripheral structure (204). This configuration is not a restriction. Alternatively, in some embodiments, the second male member (209) comparing with the first female member (207) may relatively close to the inlet (205), while the second female (210) comparing with the first male member (208) may relatively close to the inlet (205). Number of these female and male structures is not a restriction either, more or less of the female and male structures may be feasible. For example, in a specific configuration, the passage may be composed of a first horizontal extending structure, a second horizontal extending structure and a vertical extending structure, wherein the vertical extending structure is in between the first horizontal extending structure and the second horizontal extending structure while the first horizontal extending structure and the second horizontal extending structure are respectively extending at different height levels. This design is to create a passage with a level difference in order to increase a barrier for air flow. A width of said horizontal extending structures and a width of said vertical extending structures may be in a range from 0.02 mm to 0.20 mm.

According to the arrangement in FIG. 3A, air flow entering from the inlet (205) has to pass through the barriers of the first male member (208) and the second female member (210) before entering the reticle accommodation space, which reduces the possibility that particles land onto the reticle. A trench (211) may further be provided between the peripheral structure (204) and the carrier (203) of the bottom lid, the trench (211) is arranged between the outlet (206) and the reticle accommodation space and extends downward to a bottom lower than the carrying surface. The trench (211) creates a further barrier to keep particles from entering the reticle accommodation space. Plus, the carrying surface of the carrier (203) is higher than the passage, and whereby the particles are forced to fall into the bottom of the trench (211).

FIG. 3B illustrates the second embodiment of the passage. The passage includes a slope extending structure between the inlet (205) and outlet (206). The slope extending structure is defined by a first female member (207) of the cover (202) and a first male member (208) of the peripheral structure (204), wherein the first female member (207) and the first male member (208) are tapered. This presents a low-to-high slope extension from the inlet (205) to the outlet (206), while a high-to-low slope may be possible. In some embodiments, the passage may be composed of at least one horizontal extending structure and a slope extending structure.

FIG. 3C illustrates the third embodiment of the passage. The passage may include step-like extensions. As shown in the figure, the first female member (207) has two recesses of different depths, the first male member (208) has two steps of different heights. The two structures correspond to each other and form a step-like path which increases the barrier for air flow. This presents a low-to-high step-like extending structure from the inlet (205) to the outlet (206). However, a high-to-low step-like extending structure may be possible.

The passage between the inlet (205) and outlet (206) formed by the cover (202) of the top lid and the peripheral structure (204) of the bottom lid may at least include a first turning point and a second turning point. Said turning point is a passage structure where the air flow direction changes. These turning points may effectively increases the barrier for air flow. As shown in FIGS. 3A to 3C, the first female member (207) and the first male member (208) are served as a first turning point, while the second male member (209) and the second female member (210) are served as a second turning point. In this embodiment, the first turning point locates at a height level higher than that of the inlet (205), the second turning point locates at a height level lower than that of the inlet (205). The first turning point is arranged in between the inlet (205) and the second turning point. Said turning point may be formed by the male-female structures on the corresponding surfaces of the top lid (101) and the bottom lid (102). For example, a downward facing surface of the top lid may be a flat surface and an upward facing surface of the bottom lid may have multiple female-male structures. Alternatively, the upward facing surface of the bottom lid may be the flat surface and the downward facing surface of the top lid may have multiple male-female structures, or both upward and downward facing surfaces have multiple male-female structures.

FIG. 4A is a cross-sectional view according to the BB line, showing a corner structure of the reticle storage device according to the invention, which includes a supporting means used for the top lid (101) and the bottom lid (102). The cover (202) of the top lid (101) has plural supporting bumps (212) provided on four corners (or on the cover having a relative larger area) of the top lid and downward extending from the cover (202). The peripheral structure (204) of the bottom lid (102) has plural corresponding accommodation recesses (213) configured to partially receive the corresponding bumps (212) such that the cover (202) of the top lid (101) can be lifted above the peripheral structure (204) of the bottom lid (102) and form said passage. In one embodiment, the bump (212) has a height larger than a depth of the accommodation recess (213).

FIG. 4B illustrates the inside of the top lid (101). The bump (212) is formed on a surface of the cover (202) and positioned on the extending path of the second male member (209). However, the bump (212) may be formed at other places to avoid the second male member (209). The bump (212) may be integrated with the cover (202) of the top lid (101). Alternatively, in FIG. 6, the bump (212) may be a member of different material and connect to the cover (202) of the top lid (101), such as a soft bump. FIG. 4C illustrates the inside of the bottom lid (102). The accommodation recess (213) is formed on a surface of the peripheral structure (204) and communicates with the extending path of the second female member (210). However, the accommodation recess (213) may also be formed at other places to avoid the second female member (210). The bump (212) and its corresponding accommodation recess (213) are hemispherical. FIG. 5 illustrates the second embodiment, in which the bump (212) and its corresponding accommodation recess (213) may be a rectangular structure. In some embodiments, it is also possible to switch the positions of the bump and accommodation recess.

Above all, the reticle storage device according to the invention provides passages between the top lid and the bottom lid, which causes a non-sealed state for the device or reticle inner pod and balances the internal and external pressure. It is difficult for particles to arrive at the reticle accommodation space in the device due to the specific path of passages.

The above-mentioned details provide a thorough description regarding the manufacture and use of combinations of said embodiments. Various embodiments can be made without departing from the spirit and scope of such description. Thus, these embodiments will be included in the appended claims.

What is claimed is:

1. A reticle storage device, comprising:
a top lid, having a ceiling and a cover surrounding the ceiling;
a bottom lid, having a carrier and a peripheral structure surrounding the carrier; and
a plurality of bumps, configured to support the top lid above the bottom lid,
wherein the carrier and the ceiling as well as the cover define a reticle accommodation space when the top lid engages with the bottom lid, the cover of the top lid faces the peripheral structure of the bottom lid, at least one portion of the cover of the top lid and at least one portion of the peripheral structure of the bottom lid define a passage, and the reticle accommodation space is not sealed due to the passage.

2. The reticle storage device as claimed in claim 1, wherein the passage is composed of at least two sections of different directions, said at least two sections of different directions are defined by a first female member formed on the cover and a first male member formed on the peripheral structure, wherein the first female member partially receives the first male member.

3. The reticle storage device as claimed in claim 2, wherein the passage is composed of at least two sections of different directions, said at least two sections of different directions are further defined by a second male member formed on the cover and a second female member formed on the peripheral structure, wherein the second male member to is partially received in the second female member.

4. The reticle storage device as claimed in claim 3, wherein the first female member surrounding the second male member, the first male member surrounds the second female member.

5. The reticle storage device as claimed in claim 1, wherein the passage is at least composed of a first horizontal extending structure, a second horizontal extending structure and a vertical extending structure, the vertical extending structure is in between the first horizontal extending structure and the second horizontal extending structure, the first horizontal extending structure and the second horizontal extending structure are extending at different height levels respectively.

6. The reticle storage device as claimed in claim 1, wherein the peripheral structure of the bottom lid and the carrier define a trench therebetween, the trench is extending between the passage and the reticle accommodation space.

7. The reticle storage device as claimed in claim 1, wherein the plurality of bumps extends downward from the cover, the peripheral structure of the bottom lid has a plurality of accommodation recesses corresponding to the plurality of bumps and extending downward from the peripheral structure, wherein each of the accommodation recesses is configured to partially receive the corresponding bump such that the cover of the top lid is lifted above the peripheral structure of the bottom lid.

8. A reticle storage device, comprising:
a top lid, having a ceiling and a cover surrounding the ceiling; and
a bottom lid having a carrier and a peripheral structure surrounding the carrier,
wherein the carrier and the ceiling as well as the cover define a reticle accommodation space when the top lid engages with the bottom lid, the cover of the top lid faces the peripheral structure of the bottom lid, at least one portion of the cover of the top lid and at least one portion of the peripheral structure of the bottom lid define a passage, and the reticle accommodation space is not sealed due to the passage, the passage is composed of multiple sections, the passage has a first turning point and a second turning point, the first turning point and the second turning point are capable of changing air flow direction.

9. The reticle storage device as claimed in claim 8, wherein the passage further has an inlet, the first turning point locates at a height level higher than that of the inlet, the second turning point locates at a height level lower than that of the inlet.

10. The reticle storage device as claimed in claim 8, wherein the peripheral structure and the carrier define a trench therebetween, the trench is extending between the passage and the reticle accommodation space.

11. The reticle storage device as claimed in claim 8, wherein the cover of the top lid has a plurality of bumps extending downward from the cover, the peripheral structure of the bottom lid has a plurality of accommodation recesses corresponding to the bumps and extending from the peripheral structure, wherein each of the accommodation recesses is configured to partially receive the corresponding bumps such that the cover of the top lid is supported above the peripheral structure of the bottom lid.

* * * * *